United States Patent
Miyazaki et al.

(10) Patent No.: US 9,847,435 B2
(45) Date of Patent: *Dec. 19, 2017

(54) SOLAR CELL ELEMENT

(71) Applicant: KYOCERA Corporation, Kyoto-shi, Kyoto (JP)

(72) Inventors: Shiro Miyazaki, Kyoto (JP);
Tomofumi Honjo, Higashiomi (JP);
Shigeo Aono, Kyoto (JP)

(73) Assignee: KYOCERA Corporation, Kyoto (JP)

(*) Notice: Subject to any disclaimer, the term of this patent is extended or adjusted under 35 U.S.C. 154(b) by 394 days.

This patent is subject to a terminal disclaimer.

(21) Appl. No.: 14/412,411

(22) PCT Filed: Aug. 26, 2013

(86) PCT No.: PCT/JP2013/072723
§ 371 (c)(1),
(2) Date: Dec. 31, 2014

(87) PCT Pub. No.: WO2014/030765
PCT Pub. Date: Feb. 27, 2014

(65) Prior Publication Data
US 2015/0136221 A1    May 21, 2015

(30) Foreign Application Priority Data

Aug. 24, 2012  (JP) .................. 2012-185758
Mar. 22, 2013  (JP) .................. 2013-059686

(51) Int. Cl.
*H01L 31/00*    (2006.01)
*H01L 31/0216*   (2014.01)
(Continued)

(52) U.S. Cl.
CPC .... *H01L 31/02167* (2013.01); *H01L 31/0203* (2013.01); *H01L 31/068* (2013.01); *Y02E 10/547* (2013.01)

(58) Field of Classification Search
CPC ........ H01L 31/02161; H01L 31/02162; H01L 31/02164; H01L 31/02165;
(Continued)

(56) References Cited

U.S. PATENT DOCUMENTS

2009/0165849 A1* 7/2009 Chan ................. H01L 31/02165
                                                    136/256
2009/0165855 A1  7/2009 Sun et al.
(Continued)

FOREIGN PATENT DOCUMENTS

JP    2009-164544 A    7/2009
JP    2012-039088 A    2/2012

OTHER PUBLICATIONS

International Search Report dated Oct. 22, 2013, issued for International Application No. PCT/JP2013/072723.
(Continued)

*Primary Examiner* — Eli Mekhlin
(74) *Attorney, Agent, or Firm* — Procopio Cory Hargreaves and Savitch LLP

(57) ABSTRACT

To improve characteristics, reliability, and the like of a solar cell element, the solar cell element includes: a semiconductor substrate which includes a first main surface and a second main surface that is positioned opposite to the first main surface, and in which a p-type semiconductor region and an n-type semiconductor region are stacked in such a manner that the p-type semiconductor region is positioned closest to the first main surface and the n-type semiconductor region is positioned closest to the second main surface; a first passivation layer which is disposed on the p-type semiconductor region that is positioned closest to the first main surface, and which includes aluminum oxide; and a first protective layer that is disposed on the first passivation layer. The first protective layer includes an oxide that contains at least one kind of zirconium and hafnium.

16 Claims, 6 Drawing Sheets

(51) Int. Cl.
*H01L 31/068* (2012.01)
*H01L 31/0203* (2014.01)

(58) Field of Classification Search
CPC ......... H01L 31/02167; H01L 31/02168; H01L 31/0232; H01L 31/02327; H01L 31/068; H01L 31/0684
See application file for complete search history.

(56) References Cited

U.S. PATENT DOCUMENTS

2010/0263721 A1* 10/2010 Lim .................. H01L 31/02168
  136/256
2011/0303266 A1* 12/2011 Chang ............. H01L 31/022425
  136/252
2011/0308603 A1   12/2011 Vermang et al.

OTHER PUBLICATIONS

Written Opinion of the International Searching Authority issued by Japan Patent Office for International Application No. PCT/JP2013/072723.

J. Meyer et al., The origin of low water vapor transmittion rates through Al2O3/Zro2 nanolaminate gas-diffusion barriers gorwn by atomic layer deposition, Applied Physics Letters, 2010, vol. 96, p. 243308-1-243308-3.

* cited by examiner

SOLAR CELL ELEMENT

TECHNICAL FIELD

The present invention relates to a solar cell element.

BACKGROUND ART

In a solar cell element including a silicon substrate, a passivation layer is provided on a surface of the silicon substrate to improve characteristics such as electrical characteristics of the solar cell element by reducing recombination of minority carriers (for example, refer to Japanese Unexamined Patent Application Publication No. 2009-164544).

SUMMARY OF INVENTION

Technical Problem

Currently, a long operational lifetime of the solar cell element has been required. To achieve the long operational lifetime of the solar cell element, an improvement in reliability of a passivation layer becomes important.

Solution to Problem

According an aspect of the invention, there is provided a solar cell element including a semiconductor substrate including a first main surface and a second main surface that is positioned opposite to the first main surface. In addition, in the semiconductor substrate, a p-type semiconductor region and an n-type semiconductor region are stacked in such a manner that the p-type semiconductor region is positioned closest to the first main surface and the n-type semiconductor region is positioned closest to the second main surface. In addition, the solar cell element includes a first passivation layer which is disposed on the p-type semiconductor region that is positioned closest to the first main surface in the semiconductor substrate, and which includes aluminum oxide, and a first protective layer that is disposed on the first passivation layer. In addition, the first protective layer includes an oxide that contains at least one kind of zirconium and hafnium.

Effects of Invention

According to the solar cell element having the above-described configuration, it is possible to protect the passivation layer with high humidity resistance, and thus a solar cell element good in reliability can be provided.

DESCRIPTION OF EMBODIMENTS

Figure 1:
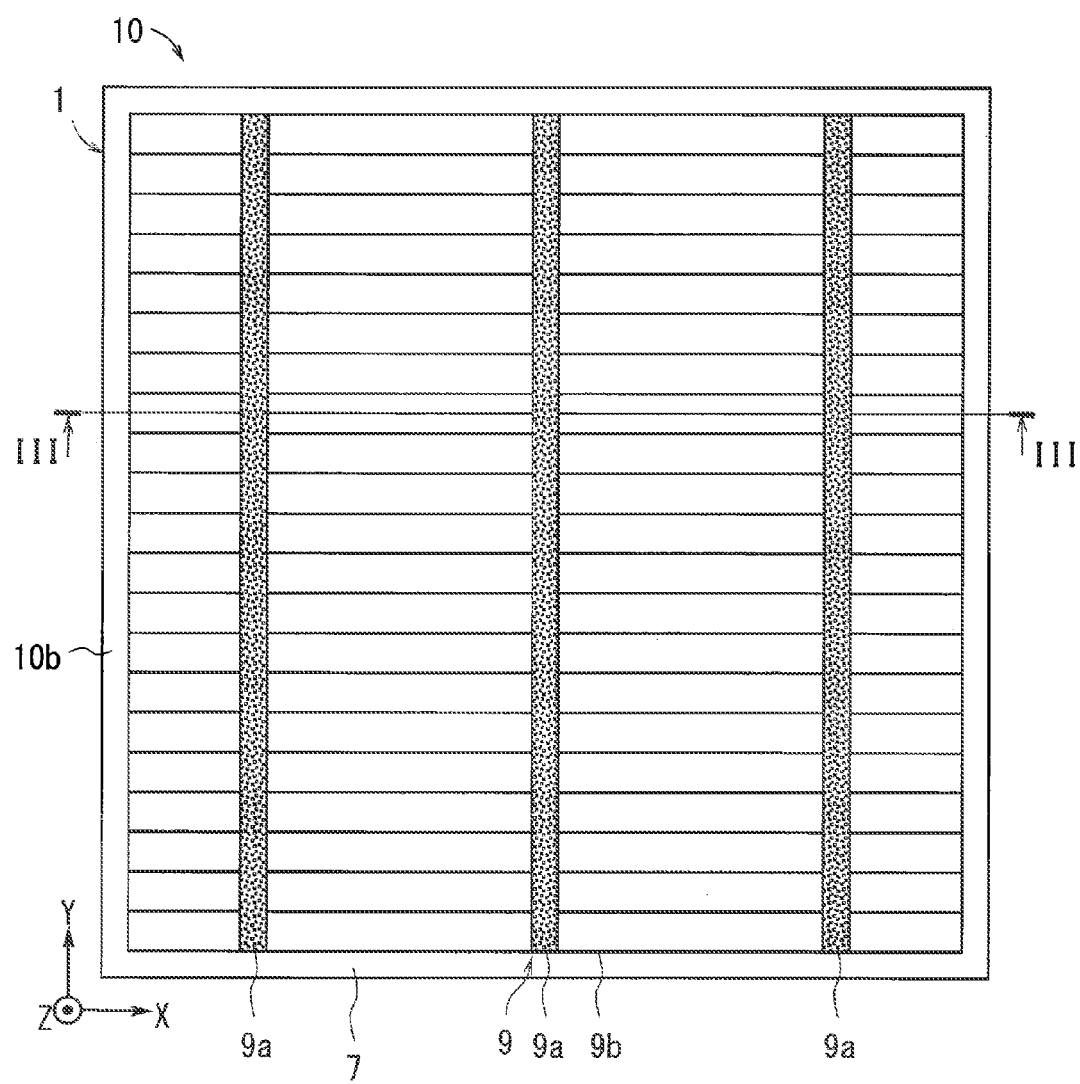
FIG. 1 is a plan view schematically illustrating external appearance of a light-receiving surface of a solar cell element according to an embodiment of the invention.

Hereinafter, an embodiment and a modification example of the invention will be described with reference to the attached drawings. The drawings are schematic, and sizes, positional relationships, and the like of various structures in the drawings may be appropriately changed. In FIGS. 1 to 5 and FIGS. 7 to 9, a right-handed XYZ coordinate system is illustrated, in which a direction (a right direction in FIG. 1) perpendicular to an extension direction of a first output electrode 8$a$ is set as +X direction. In FIG. 3 that is a cross-sectional view, hatching is given to only a part for simplicity.

<Solar Cell Element>

Figure 2:
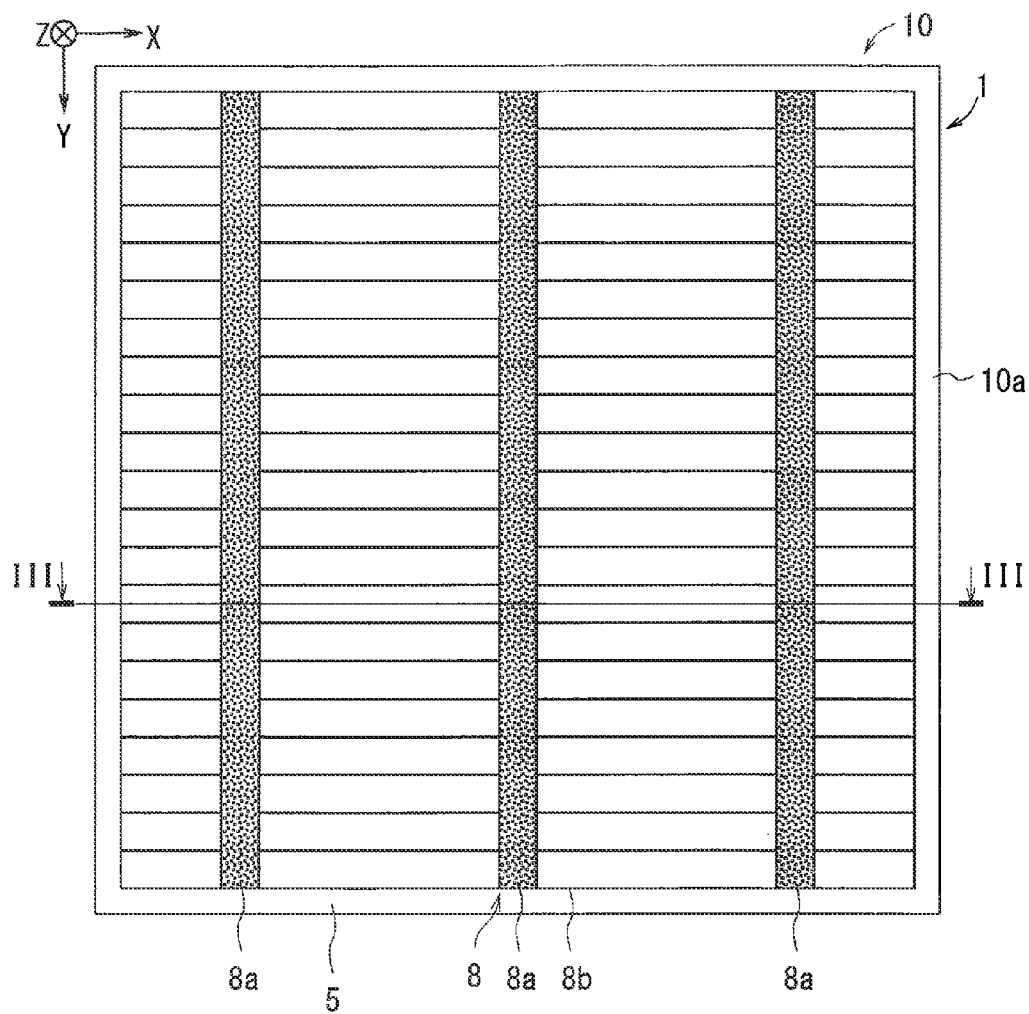
FIG. 2 is a plan view schematically illustrating an external appearance of a non-light-receiving surface of the solar cell element according to the embodiment of the invention.
Figure 3:
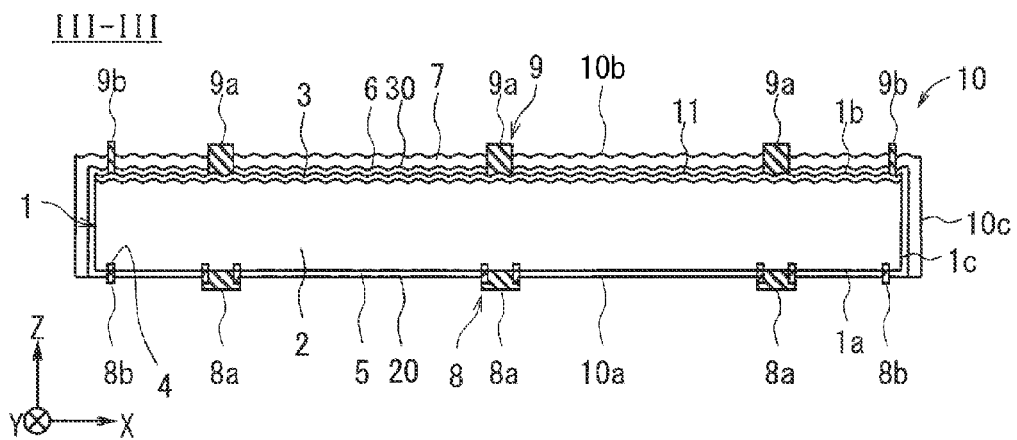
FIG. 3 is a view illustrating an XZ cross-section at a position indicated by line III-III in FIGS. 1 and 2.

As illustrated in FIGS. 1 to 3, a solar cell element 10 includes a first main surface 10$a$, a second main surface 10$b$, and a side surface 10$c$. The second main surface 10$b$ is a surface (light-receiving surface) that mainly receives incident light. The first main surface 10$a$ is a surface (for example, a non-light-receiving surface) that is positioned opposite to the second main surface 10$b$ of the solar cell element 10. The side surface 10$c$ is a surface that connects the first main surface 10$a$ and the second main surface 10$b$. In FIG. 3, the second main surface 10$b$ is illustrated as an upper surface of the solar cell element 10 on a +Z direction side, and the first main surface 10$a$ is illustrated as a lower surface of the solar cell element 10 on a −Z direction side.

Figure 4:
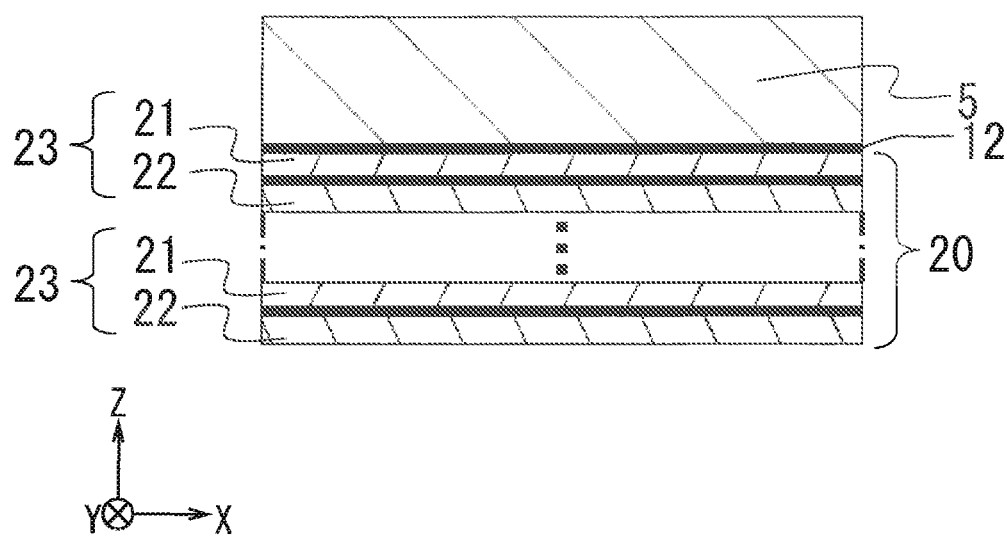
FIG. 4 is an enlarged cross-sectional view schematically illustrating a first protective layer in FIG. 3.
Figure 5:
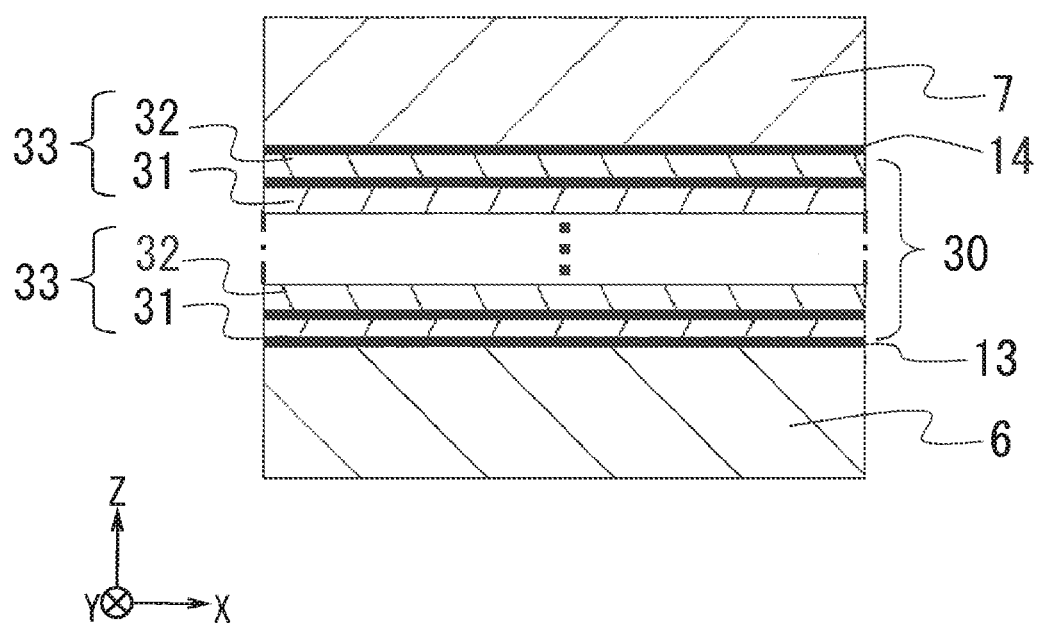
FIG. 5 is an enlarged cross-sectional view schematically illustrating a second protective layer in FIG. 3.

The solar cell element 10 includes a semiconductor substrate 1, a first passivation layer 5, a second passivation layer 6, an antireflective layer 7, a first electrode 8, and a second electrode 9. Furthermore, the solar cell element 10 includes at least a first protective layer 12 on the first passivation layer 5. The solar cell element 10 may further include a layer, other than the first protective layer 12, which functions as a protective layer on the first passivation layer 5. For example, as illustrated in FIG. 4, the first protective layer 12 and a first repetitive structure 20, which function as protective layers, are stacked in this order on the first passivation layer 5. In addition, for example, as illustrated in FIG. 5, a second protective layer 13 and a second repetitive structure 30, which have the same structure as the first protective layer 12 and the first repetitive structure 20, respectively, may be interposed between the second passivation layer 6 and the antireflective layer 7. Here, all of the first protective layer 12, the first repetitive structure 20, the second protective layer 13, and the second repetitive structure 30 include an oxide that contains at least one of zirconium (Zr) and hafnium (Hf).

Note that, passivation effects of the first passivation layer 5 and the second passivation layer 6 include a passivation effect (a field-effect passivation) due to a built-in electric field (which is formed in the vicinity of an interface with a presence of a passivation layer), and a passivation effect (a chemical passivation) due to passivation of dangling bonds on the interface. Here, the field-effect passivation represents that the greater a density of fixed charges of the passivation layer is, the more effective. For example, in a p-type silicon, the greater a density of negative fixed charges of the passivation layer is, the more effective. On the other hand, the chemical passivation represents that the smaller an interface state density is, the more effective.

A semiconductor substrate 1 has a configuration in which a first semiconductor region 2 that is a p-type semiconductor region and a second semiconductor region 3 that is an n-type semiconductor region are stacked on each other. Here, the first semiconductor region 2 is positioned closest to a first main surface 1a (a surface on a −Z direction side in the drawing) of the semiconductor substrate 1, and the second semiconductor region 3 is positioned closest to a second main surface 1b (a surface on a +Z direction side in the drawing) of the semiconductor substrate 1. The first semiconductor region 2 is a p-type conductive semiconductor region, and the second semiconductor region 3 is an n-type conductive semiconductor region. The first semiconductor region 2 and the second semiconductor region 3 form a pn junction region. Note that, for example, the semiconductor substrate 1 may further include a semiconductor junction region other than the pn junction region, in which a different semiconductor region such as an i-type semiconductor region is interposed between the first semiconductor region 2 and the second semiconductor region 3.

As a semiconductor of the first semiconductor region 2, for example, crystal silicon (c-Si) such as single crystal silicon and polycrystal silicon, or amorphous silicon (a-Si) may be employed. Here, as a p-type dopant, for example, at least any one of boron (B) and gallium (Ga) is employable, and thus the first semiconductor region 2 has a p-type conductivity type. The thickness of the first semiconductor region 2 is 250 μm or less, for example, or may be 150 μm or less. Although a shape of the first semiconductor region 2 is not particularly limited, when the shape is, for example, a rectangular shape in a plan view, manufacturing of the first semiconductor region 2 is easy.

The second semiconductor region 3 is formed in a surface layer on a second main surface 1b side of a p-type silicon substrate (hereinafter, referred to as a crystal silicon substrate), as a result of diffusion of an element that functions as a n-type dopant to a region on the second main surface 1b side of the crystal silicon substrate. At this time, a portion other than the second semiconductor region 3 in the crystal silicon substrate may be the first semiconductor region 2. Note that, as the n-type dopant, phosphorous (P) and the like are appropriate.

As illustrated in FIG. 3, a concavo-convex portion 11 is disposed in the second main surface 1b of the semiconductor substrate 1. Here, it is adequate that the height of a convex portion in the concavo-convex portion 11 is, for example, not less than 0.1 μm and not more than 10 μm, and the width of the convex portion is, for example, approximately not less than 1 μm and not more than 20 μm. In addition, as a surface shape of a concave portion of the concavo-convex portion 11, for example, an approximately spherical shape is appropriate. Here, the height of the convex portion described above represents a distance from a reference surface to a top surface of the convex portion in a normal direction of the reference surface, in which a surface that passes through a bottom surface of the concave portion and is parallel with the first main surface 10a is set as the reference (the reference surface). In addition, the width of the convex portion represents a distance between bottom surfaces of adjacent concave portions in a direction parallel with the reference surface.

The first passivation layer 5 is disposed on a first main surface 1a side of the semiconductor substrate 1. That is, the first passivation layer 5 is disposed on the first main surface 1a side of the first semiconductor region 2. As a material of the first passivation layer 5, for example, it is appropriate that aluminum oxide is employed. In a case where the first passivation layer 5 is present in the solar cell element 10, recombination of the minority carriers is reduced in the first main surface 1a of the semiconductor substrate 1 due to the passivation effect. Accordingly, an open-circuit voltage and a short-circuit current increase, and thus output characteristics of the solar cell element 10 are improved. Here, it is adequate that an average value of the thickness of the first passivation layer 5 is, for example, approximately not less than 3 nm and not more than 100 nm. In addition, a layer which functions as a passivation layer may be further interposed between the first semiconductor region 2 and the first passivation layer 5. For example, when the first passivation layer is formed of aluminum oxide, an oxide layer such as silicon oxide, which includes silicon and functions as a passivation, may be interposed between the first semiconductor region 2 and the first passivation layer 5.

In the first passivation layer 5, when aluminum oxide has a certain density of negative fixed charges, an energy band bends in a direction in which number of electrons being minority carriers decreases in the vicinity of an interface with the first passivation layer 5 in the first semiconductor region 2. Specifically, in the first semiconductor region 2, the energy band bends in such a manner that the closer to the interface with the first passivation layer 5, the further an electronic potential increases. Accordingly, a passivation effect due to a so-called built-in electric field increases. In addition, with regard to the first passivation layer 5, if its composition and the like are appropriately adjusted, the passivation effects due to the built-in electric field and the passivation of the dangling bonds increase.

The second passivation layer 6 is disposed on a second main surface 1b side of the semiconductor substrate 1. That is, the second passivation layer 6 is disposed on a second main surface 1b side of the second semiconductor region 3. In a case where the second passivation layer 6 is present, recombination of the minority carriers on the second main surface 1b side of the semiconductor substrate 1 is reduced by the passivation effect due to the so-called passivation of dangling bonds. Accordingly, the open-circuit voltage and the short-circuit current of the solar cell element 10 increase, and thus output characteristics of the solar cell element 10 are improved. Note that, it is adequate that an average value of the thickness of the second passivation layer 6 is, for example, approximately not less than 3 nm and not more than 100 nm.

Here, in a case where aluminum oxide is employed as a material of the second passivation layer 6, for example, an antireflective layer 7 having a density of positive fixed charges or a density of negative fixed charges smaller than that of aluminum oxide may be disposed on the second passivation layer 6. When the above-described configuration is employed, the second passivation layer 6 has density of negative fixed charges and thus a problem of bending of an energy band in the vicinity of an interface with the second passivation layer 6 in the second semiconductor region 3, which is the bending in a direction in which number of holes being the minority carriers increases, is reduced. As a result, a characteristic deterioration due to an increase in recombination of the minority carriers on the second main surface 1b side of the semiconductor substrate 1 is suppressed.

Note that, the first passivation layer 5 and the second passivation layer 6 can be easily formed using an ALD (Atomic Layer Deposition) method. In the ALD method, for example, an organic metal gas that contains aluminum (Al) such as trimethyl aluminum (TMA) and triethyl aluminum (TEA) as a supply source of aluminum, and an oxygen (O) containing gas such as ozone ($O_3$) and water ($H_2O$) which oxidize aluminum are set as raw materials.

As illustrated in FIG. 4, the first protective layer 12 having a thickness of, for example, 50 nm or less is disposed on the first passivation layer 5. When the first protective layer 12 is present in the solar cell element 10, moisture permeation from the outside is suppressed, and thus the passivation effect may not be damaged. As a result, it is possible to improve reliability and the like without doing damage in electrical characteristics of the solar cell element 10. In a case where the first protective layer 12 is formed, for example, by a film forming method, the first protective layer 12 is formed and disposed by the ALD method, a sputtering method, a MOCVD (Metal Organic Chemical Vapor Deposition) method, a P-CVD (Plasma Chemical Vapor Deposition) method, and the like. In addition, the first protective layer 12 may be naturally formed during formation of an oxide layer formed of zirconium oxide or hafnium oxide on the first passivation layer 5. In a case where the oxide layer is formed on the first passivation layer 5, for example, by the ALD method, the sputtering method, the MOCVD method, the P-CVD method, and the like, the first protective layer 12 is naturally formed between the oxide layer and the first passivation layer 5. In this case, the thickness of the first protective layer 12 is approximately 1 nm or less.

The first protective layer 12 includes an oxide that contains at least one kind of zirconium and hafnium. In a case where the first protective layer 12 is an oxide containing zirconium, examples of the oxide include $Zr_xAl_yO_{1-x-y}$, $Zr_xMg_yO_{1-x-y}$, $Zr_xCa_yO_{1-x-y}$, $Zr_xY_yO_{1-x-y}$, and the like. In a case where the first protective layer 12 is an oxide containing hafnium, examples of the oxide include $Hf_xAl_yO_{1-x-y}$, $Hf_xMg_yO_{1-x-y}$, $Hf_xCa_yO_{1-x-y}$, $Hf_xY_yO_{1-x-y}$, and the like. Here, x and y described above satisfy relationships of $0<y<1$, $0<x<1$, and $x+y<1$. All of these oxides are superior in terms of suppression of moisture permeation, thermal stability, and the like. Particularly, employing $Zr_xAl_yO_{1-x-y}$ or $Hf_xAl_yO_{1-x-y}$ among the oxides is preferable, because they can be easily manufactured in a case where the first passivation layer 5 is constituted by an $AlO_x$ film.

As illustrated in FIG. 4, a first oxide layer 21, which is formed of zirconium oxide (for example, $ZrO_2$) or hafnium oxide (for example, $HfO_2$), may be disposed on the first protective layer 12. Furthermore, a second oxide layer 22, which is formed of aluminum oxide, may be disposed on the first oxide layer 21. That is, a first protective unit layer 23, in which the first oxide layer 21 and the second oxide layer 22 are provided in this order from a position close to the first passivation layer 5 to a position distant from the first passivation layer 5, may be disposed. For example, as illustrated in FIG. 4, the first protective unit layer 23, in which the first oxide layer 21 being a zirconium oxide layer or a hafnium oxide layer and the second oxide layer 22 being an aluminum oxide layer are stacked in this order from a side close to the first passivation layer 5 to a side distant from the first passivation layer 5, may be provided. The thickness of each of the first oxide layer 21 and the second oxide layer 22 is, for example, not less than 0.1 nm and not more than 10 nm.

In this case, the same oxide layer as the first protective layer 12 may be formed at an interface between two oxide layers (between the first oxide layer 21 and the second oxide layer 22). In a case where the first oxide layer 21 is formed of zirconium oxide, for example, a composite oxide layer such as $Zr_xAl_yO_{1-x-y}$ may be naturally formed between the first oxide layer 21 and the second oxide layer 22 in a thickness of approximately 1 nm or less. Or else, in a case where the first oxide layer 21 is formed of hafnium oxide, a composite oxide layer such as $Hf_xAl_yO_{1-x-y}$ may be naturally formed between the first oxide layer 21 and the second oxide layer 22 in a thickness of approximately 1 nm or less. It is preferable that such a composite oxide layer be present, because thermal stability and moisture-impermeable properties of the solar cell element 10 are improved due to the presence of the composite oxide layer.

Particularly, it is preferable that the first repetitive structure 20 in which a plurality of the first protective unit layers 23 are stacked is provided, as illustrated in FIG. 4, because a plurality of composite oxide layers are present, and thus the above-described operational effect becomes significant. In a case where the first repetitive structure 20 in which the plurality of first protective unit layers 23 are stacked is provided, an oxide layer that contains zirconium and aluminum or an oxide layer that contains hafnium and aluminum may be interposed between the first protective unit layers 23 that are adjacent to each other. In a case where the first oxide layer 21 is formed from zirconium oxide, a composite oxide layer such as $Zr_xAl_yO_{1-x-y}$ may be naturally formed between the first protective unit layers 23 that are adjacent to each other in a thickness of approximately 1 nm or less. In addition, In a case where the first oxide layer 21 is formed from hafnium oxide, a composite oxide layer such as $Hf_xAl_yO_{1-x-y}$ may be naturally formed between the first protective unit layers 23 that are adjacent to each other in a thickness of approximately 1 nm or less.

As illustrated in FIG. 5, for example, the second protective layer 13 having the same composition as that of the first protective layer 12 may be disposed on the second passivation layer 6 in a thickness of not more than 50 nm. The second protective layer 13 also has the same operational effect as that of the first protective layer 12. For example, in a case of forming the second protective layer 13 by a film forming method, the second protective layer 13 is formed and disposed by the ALD method, the sputtering method, the MOCVD method, the P-CVD method, and the like. When the second protective layer 13 is present in the solar cell element 10, the moisture permeation from the outside is suppressed, and thus the passivation effect may not be damaged. As a result, it is possible to improve reliability and the like without damage in electrical characteristics of the solar cell element 10. Furthermore, the second protective layer 13 may be naturally formed when the oxide layer formed of zirconium oxide or hafnium oxide is formed on the second passivation layer 6. For example, when the oxide layer is formed on the second passivation layer 6 by the ALD method, the sputtering method, the MOCVD method, the P-CVD method, and the like, the second protective layer 13 is naturally formed between the oxide layer and the second passivation layer 6. In this case, the thickness of the second protective layer 13 is approximately 1 nm or less.

The second protective layer 13 may include an oxide that contains at least one kind of zirconium and hafnium. In a case where the second protective layer 13 is an oxide containing zirconium, examples of the oxide include $Zr_xAl_yO_{1-x-y}$, $Zr_xMg_yO_{1-x-y}$, $Zr_xCa_yO_{1-x-y}$, $Zr_xY_yO_{1-x-y}$, and the like. In addition, in a case where the second protective layer 13 is an oxide containing hafnium, examples of the oxide include $Hf_xAl_yO_{1-x-y}$, $Hf_xMg_yO_{1-x-y}$, $Hf_xCa_yO_{1-x-y}$, $Hf_xY_yO_{1-x-y}$, and the like. Here, x and y described above satisfy relationships of 0<y<1, 0<x<1, and x+y<1. All of these oxides are superior in terms of suppression of moisture permeation, thermal stability, and the like. Particularly, employing $Zr_xAl_yO_{1-x-y}$ or $Hf_xAl_yO_{1-x-y}$ among the oxides, is preferable, because they can be easily manufactured in a case where the second passivation layer 6 is constituted by an $AlO_x$ film.

In addition, as illustrated in FIG. 5, a third oxide layer 31, which is formed of zirconium oxide or hafnium oxide, may be disposed on the second passivation layer 6. Furthermore, a fourth oxide layer 32, which is formed of aluminum oxide, may be disposed on the third oxide layer 31. That is, a second protective unit layer 33, in which the third oxide layer 31 and the fourth oxide layer 32 are provided in this order from a position close to the second passivation layer 6 to a position distant from the second passivation layer 6, may be disposed. For example, as illustrated in FIG. 5, the second protective unit layer 33, in which the third oxide layer 31 that is a zirconium oxide layer or a hafnium oxide layer and the fourth oxide layer 32 that is an aluminum oxide layer are stacked in this order from a side close to the second passivation layer 6 to a side distant from the second passivation layer 6, may be provided. The thickness of each of the third oxide layer 31 and the fourth oxide layer 32 is, for example, not less than 0.1 nm and not more than 10 nm.

In this case, the same oxide layer as the second protective layer 13 may be formed at an interface of two oxide layers (between the third oxide layer 31 and the fourth oxide layer 32). For example, in a case where the third oxide layer 31 is formed of zirconium oxide, a composite oxide layer such as $Zr_xAl_yO_{1-x-y}$ may be naturally formed between the third oxide layer 31 and the fourth oxide layer 32 in a thickness of approximately 1 nm or less. In addition, for example, in a case where the third oxide layer 31 is formed of hafnium oxide, a composite oxide layer such as $Hf_xAl_yO_{1-x-y}$ may be naturally formed between the third oxide layer 31 and the fourth oxide layer 32 in a thickness of approximately 1 nm or less. It is preferable that such a composite oxide layer be present, because thermal stability and moisture-impermeable properties of the solar cell element 10 can be further improved due to the presence of the composite oxide layer.

Particularly, as illustrated in FIG. 5, in a case where the second repetitive structure 30 in which a plurality of the second protective unit layers 33 are stacked is provided, a plurality of composite oxide layers are present, and thus the above-described operational effect becomes significant. In a case where the second repetitive structure 30 in which the plurality of second protective unit layers 33 are stacked is provided, an oxide layer that contains zirconium and aluminum or an oxide layer that contains hafnium and aluminum may be interposed between the second protective unit layers 33 that are adjacent to each other. For example, in a case where the third oxide layer 31 is formed of zirconium oxide, a composite oxide layer such as $Zr_xAl_yO_{1-x-y}$ may be naturally formed between the second protective unit layers 33 that are adjacent to each other in a thickness of approximately 1 nm or less. In addition, for example, in a case where the third oxide layer 31 is formed of hafnium oxide, a composite oxide layer such as $Hf_xAl_yO_{1-x-y}$ may be naturally formed between the second protective unit layers 33 that are adjacent to each other in a thickness of approximately 1 nm or less.

Note that, the first protective layer 12, the first repetitive structure 20, the second protective layer 13, and the second repetitive structure 30 may have negative fixed charges that are substantially the same in amount as that of the first passivation layer 5 and the second passivation layer 6 to retain the passivation effect.

The antireflective layer 7 is a layer that improves light-absorbing efficiency in the solar cell element 10. The antireflective layer 7 is disposed on a second main surface 10b side of the second passivation layer 6. As a material of the antireflective layer 7, silicon nitride, silicon oxide, and the like are appropriate, for example. The thickness of the antireflective layer 7 may be appropriately set in accordance with the material of the semiconductor substrate 1 and the antireflective layer 7.

When the antireflective layer 7 is formed of silicon nitride ($Si_3N_4$ and the like) or silicon oxide, a third protective layer 14 formed of an oxide that contains aluminum and silicon may be naturally formed between the antireflective layer 7 and the fourth oxide layer 32 adjacent thereto in a thickness of approximately 1 nm or less.

Here, the presence of elements, which constitute the first protective layer 12, the oxide layer present between the first oxide layer 21 and the second oxide layer 22, the oxide layer present between the first protective unit layers 23 adjacent to each other, the second protective layer 13, the oxide layer present between the third oxide layer 31 and the fourth oxide layer 32, the oxide layer present between the second protective unit layers 33 adjacent to each other, and the oxide layer present between the antireflective layer 7 and the fourth oxide layer 32 adjacent thereto, can be confirmed by an analysis method such as SIMS (Secondary Ion Mass Spectrometry, TEM (Transmission Electron Microscope), EELS (Electron Energy-Loss Spectroscopy), XPS (X-ray Photoelectron Spectroscopy), and RBS (Rutherford Backscattering Spectrometry).

Owing to including the antireflective layer 7 in the solar cell element 10 as described above, conditions that light in a specific wavelength region is less likely to be reflected, are realized in the solar cell element 10. Here, the light in a specific wavelength region represents a wavelength region back and forth of a peak wavelength with irradiation intensity of solar light. Note that, in a case where the semiconductor substrate 1 is a crystal silicon substrate, it is adequate that a refractive index of the antireflective layer 7 is, for example, approximately not less than 1.8 and not more than 2.3, and an average value of the thickness of the antireflective layer 7 may be, for example, approximately not less than 20 nm and not more than 120 nm.

Note that, the antireflective layer 7 may be provided on a side surface 10c side of the semiconductor substrate 1. In this case, particularly, when the antireflective layer 7 is formed by the ALD method, the antireflective layer 7 becomes dense, and thus formation of a minute opening such as a pinhole is also greatly reduced on the side surface 10c side of the semiconductor substrate 1. As a result, it is possible to prevent characteristics from deteriorating due to generation of a leakage current.

A third semiconductor region 4 is disposed on a first main surface 1a side of the semiconductor substrate 1. The third semiconductor region 4 has the same p-type conductivity type as the first semiconductor region 2. In addition, a dopant concentration in the third semiconductor region 4 is higher than a dopant concentration in the first semiconductor region 2. That is, the third semiconductor region 4 is formed by doping the semiconductor substrate 1 with a p-type dopant in a concentration higher than that in a case of doping the semiconductor substrate 1 with a p-type dopant to form the first semiconductor region 2.

The third semiconductor region 4 plays a role of allowing a built-in electric field to form on the first main surface 1a side of the semiconductor substrate 1 to reduce recombination of the minority carriers in a region on the first main surface 1a side of the semiconductor substrate 1. Accordingly, it is possible to further increase conversion efficiency in the solar cell element 10 due to presence of the third semiconductor region 4. Note that, the third semiconductor region 4 is formed, for example, by doping the semiconductor substrate 1 on the first main surface 1 a side with a dopant such as boron, aluminum, and the like.

The first electrode 8 is disposed on the first main surface 1a side of the semiconductor substrate 1. As illustrated in FIG. 2, for example, the first electrode 8 includes a plurality of the first output electrodes 8a which extend in the Y direction, and a plurality of linear first current collecting electrodes 8b which extend in the X direction. Here, at least parts of the first output electrodes 8a intersect the plurality of linear first current collecting electrodes 8b and are electrically connected to the plurality of first current collecting electrodes 8b.

It is adequate that a width of each of the first current collecting electrodes 8b in a short side direction is, for example, approximately not less than 50 μm and not more than 300 μm. It is adequate that a width of each of the first output electrodes 8a in a short side direction is, for example, approximately not less than 1.3 mm and not more than 3 mm. That is, it is appropriate that the width of the first current collecting electrode 8b in the short side direction is smaller than the width of the first output electrode 8a in the short side direction. It is adequate that an interval between the first current collecting electrodes 8b adjacent to each other among the plurality of the first current collecting electrodes 8b is approximately not less than 1.5 mm and not more than 3 mm. It is adequate that the thickness of the first electrode 8 is, for example, approximately not less than 10 μm and not more than 40 μm. Note that, the first electrode 8 is formed by, for example, applying conductive paste (silver paste) that contains silver as a main component on the first main surface 1a of the semiconductor substrate 1 with a desired pattern through screen printing and the like, and by firing the applied paste. Alternatively, aluminum may be mainly used as a material of the first current collecting electrode 8b, and silver may be mainly used as a material of the first output electrode 8a.

The second electrode 9 is disposed on a second main surface 1b side of the semiconductor substrate 1. As illustrated in FIG. 1, for example, the second electrode 9 includes a plurality of the second output electrodes 9a which extend in the Y direction, and a plurality of linear second current collecting electrodes 9b which extend in the X direction. Here, at least parts of the second output electrode 9a intersect the plurality of linear second current collecting electrodes 9b and are electrically connected to the plurality of second current collecting electrodes 9b.

It is adequate that a width of each of the second current collecting electrodes 9b in a short length direction is, for example, approximately not less than 50 μm and not more than 200 μm. It is adequate that a width of each of the second output electrodes 9a in a short length direction is, for example, approximately not less than 1.3 mm and not more than 2.5 mm. That is, it is appropriate that the width of the second current collecting electrode 9b in the short length direction is smaller than the width of the second output electrode 9a in the length side direction. It is adequate that an interval between the second current collecting electrodes 9b adjacent to each other among the plurality of second current collecting electrodes 9b is approximately not less than 1.5 mm and not more than 3 mm. It is adequate that the thickness of the second electrode 9 is, for example, not less than 10 μm and not more than 40 μm. Note that, the second electrode 9 is formed by, for example, applying the silver paste on the second main surface 1b of the semiconductor substrate 1 with a desired pattern through screen printing and the like, and by firing the applied paste.

<Passivation Effect>

Typically, aluminum oxide has a stoichiometric composition of $Al_2O_3$ in which a ratio (first ratio) $R_{Al/O}$ of an atomic density of aluminum (Al) on the basis of an atomic density of oxygen (O) is 2/3. Here, the atomic density represents the number of atoms per unit volume, and is expressed, for example, by the number of atoms per 1 $cm^3$ (unit is atoms/$cm^3$). However, when the first ratio $R_{Al/O}$ is less than 2/3, specifically, when the first ratio obtained by dividing the atomic density of aluminum by the atomic density of oxygen is less than 0.667, a portion in which Al is deficient may be present. It is considered that, in aluminum oxide that constitutes the passivation layer of this embodiment, the negative fixed charges are generated due to a composition deficiency of Al. In this case, it is assumed that aluminum oxide has a nonstoichiometric composition, and has an amorphous structure close to γ-alumina. This is confirmed by TEM, EELS, and the like.

In aluminum oxide of this embodiment, the larger the composition deficiency of Al is, the more the density of the negative fixed charges may increase. However, when forming the first passivation layer 5, a composition of approximately $Al_{1.9}O_{3.1}$ is the lower limit relating to the composition deficiency of Al in aluminum oxide having the nonstoichiometric composition. When the Al deficiency is suppressed as described above, a film density (denseness) of aluminum oxide does not excessively decrease, and thus film quality is less likely to deteriorate. That is, electrical leakage is less likely to occur, and humidity resistance is less likely to decrease. Accordingly, it is possible to obtain satisfactory film quality of aluminum oxide, and it is possible to retain characteristics and long-term reliability of the solar cell element. In $Al_{1.9}O_{3.1}$, the first ratio $R_{Al/O}$ becomes approximately 0.613($\approx$1.9/3.1). Accordingly, when the first ratio $R_{Al/O}$ is 0.613 or greater and is less than 0.667, the aluminum oxide may have large density of negative fixed charges.

When hydrogen (H), $CH_n$ (n is a natural number), and the like are contained in aluminum oxide, at an interface between the first passivation layer 5 and the first semiconductor region 2, the dangling bonds of the silicon (Si) in the first semiconductor region 2 are passivated by H, OH, $CH_n$ (n is a natural number), O, and the like. That is, an interface state density is reduced, and thus the passivation effect increases.

However, in aluminum oxide, if Al is merely deficient, holes of electron are generated in a 2 p orbital of O at the Al deficient portion. Accordingly, an acceptor level is created. In this case, according to first principle calculation, due to deficiency of trivalent Al, aluminum oxide receives electrons from silicon which is joined to aluminum oxide, so that a fixed charge Q at the Al deficient portion may be negative trivalent, . . . In contrast, when H atoms are contained in aluminum oxide, H may be present in the Al deficient portion and an interstitial site of aluminum oxide. Accordingly, in aluminum oxide, a monovalent H atom may be coupled to an O (OH coupling) atom at the Al deficient portion. At this time, the fixed charge Q at the Al deficient portion increases from negative trivalent to negative divalent, but it is assumed that instability at the Al deficient portion may be mitigated due to the OH coupling. Accordingly, stability of aluminum oxide in a nonstoichiometric composition having Al deficiency can increase. As a result, the Al deficient portion in aluminum oxide may be less likely to disappear, even though a heat treatment is performed, for example, when the antireflective layer 7, the first electrode 8, and the second electrode 9 are formed after the first passivation layer 5 has been formed.

Here, in a case where the atomic density of H is equal to or more than the number of Al deficient portions in aluminum oxide, H is coupled with O in approximately all Al deficient portions, and thus stability of the Al deficient portion may increase. In aluminum oxide as described above, when a ratio (second ratio) $R_{(Al+H)/O}$ of the sum of the atomic density of Al and the atomic density of H on the basis of the atomic density of O is 2/3 or more, specifically 0.667 or more, the stability of the Al deficient portion may increase.

In this case, for example, a generation mechanism of negative fixed charges on an aluminum oxide side is considered as follows.

Primary reaction Si:Si/Al:O:H→Si.Si/Al:O:+.H
Secondary reaction .H+.H→H:H
Secondary reaction Al:O:CH$_3$+.H→Al:O:H+.CH$_3$
Hereinafter, a different secondary reaction continues.

Here, in the above reaction formula, it is defined that "." represent an electron, and "/" represents an interface. Besides, in the above reaction formula, electrons that do not participate in coupling are omitted. Note that, the plurality of secondary reactions proceed in parallel.

In the primary reaction, since electrons on a Si side move to an aluminum oxide side, positive charges are generated on the Si side, and negative charges are generated on the aluminum oxide side.

The positive charges that are generated on the Si side act to let the energy band of Si bend toward an interface. This means that, for electrons in a conduction band, which are minority carriers, a potential barrier is formed. Thus, the recombination of electrons that are flowed to an interface is suppressed. That is, an effect of increasing an effective lifetime of the minority carriers is exhibited (field-effect passivation).

On the other hand, negative charges that are generated on the aluminum oxide side are fixed in aluminum oxide in the vicinity of the interface. That is, the negative charges become negative fixed charges. This negative fixed charges in aluminum oxide are very stable, and thus do not disappear even during a process (a high-temperature process such as firing, and the like) of manufacturing the solar cell element. That is, stable presence of the negative fixed charges guarantees the stability of the positive charges on the Si side (the stability of field-effect passivation).

According to the above-described mechanism, in the first semiconductor region 2, the energy band bends in such a manner that the closer a position is to an interface with the first passivation layer 5, the further energy of electrons increase. Accordingly, the passivation effect due to the so-called built-in electric field can be increased. In addition, with regard to the first passivation layer 5, when a composition and the like are appropriately adjusted, the passivation effect due to the built-in electric field can be further increased. Here, the second ratio $R_{(Al+H)/O}$ is a value obtained by dividing the sum of the atomic density of Al and the atomic density of H by the atomic density of O.

In aluminum oxide, the larger an amount of H is, the more H is likely to be coupled with O at substantially all deficient portions of Al. However, when forming the first passivation layer 5, a composition of approximately $(Al+H)_{2.2}O_{2.8}$ is the upper limit relating to the amount of H in aluminum oxide having the nonstoichiometric composition. When not exceeding the upper limit, a film density (denseness) of the aluminum oxide film is suppressed from excessively decreasing, and thus film quality is less likely to deteriorate. That is, electrical leakage is less likely to occur, and humidity resistance is less likely to decrease. Accordingly, it is possible to retain characteristics and long-term reliability of the solar cell element.

In $(Al+H)_{2.2}O_{2.8}$, the second ratio $R_{(Al+H)/O}$ becomes approximately 0.786 (≈2.2/2.8). Accordingly, when the second ratio $R_{(Al+H)/O}$ is 0.667 or greater and is less than 0.786, it is possible to increase stability of the Al deficient portion in aluminum oxide having a nonstoichiometric composition. That is, the passivation effect due to aluminum oxide can be stably generated.

As described above, at the inside of the first passivation layer 5, when the first ratio $R_{Al/O}$ is 0.613 or greater and is less than 0.667, and the second ratio $R_{(Al+H)/O}$ is 0.667 or greater and is less than 0.786, the passivation effect due to aluminum oxide can be stably exhibited. As a result, an effective lifetime necessary for recombination of the minority carriers in the first semiconductor region 2 can be extended. That is, conversion efficiency in the solar cell element 10 can be further increased due to an improvement in the passivation effect.

Note that, here, it is appropriate that the inside of the first passivation layer 5 is interpreted, for example, as an inner portion excluding the vicinity of both main surfaces of the first passivation layer 5 in a thickness direction. That is, the vicinity of the interface with the first semiconductor region 2 in the first passivation layer 5 is not included in the inside of the first passivation layer 5. In addition, the inside of the first passivation layer 5 may be the central portion of the first passivation layer 5 in the thickness direction. It is appropriate that the vicinity of the interface with the first semiconductor region 2 in the first passivation layer 5 is interpreted, for example, as a region inside the first passivation layer 5 which corresponds to a thickness of approximately not less than 3 nm and not more than 10 nm from the interface between the first passivation layer 5 and the first semiconductor region 2. Note that, when the thickness of the first passivation layer 5 is 10 nm or less, a region which corresponds to approximately the entire thickness in the first passivation layer 5 may be regarded as the vicinity of the interface.

When the first ratio $R_{Al/O}$ in the vicinity of the interface with the first semiconductor region 2 in the first passivation layer 5 is larger than the first ratio $R_{Al/O}$ in the central portion in the thickness direction of the first passivation layer 5, the passivation effect due to the built-in electric field and the passivation effect due to passivation of the dangling bonds of Si atoms in the interface can be improved. That is, the effective lifetime in the first semiconductor region 2 is extended, and thus the conversion efficiency in the solar cell element 10 can be further increased.

Moreover, when the first passivation layer 5 contains carbon (C), the passivation effect can be improved. For example, it is appropriate that the sum (total atomic density) $A_{H+C}$ of the atomic density $A_H$ of H and the atomic density $A_C$ of C in the vicinity of the interface with the first semiconductor region 2 in the first passivation layer 5 be larger than the total atomic density $A_{H+C}$ at the central portion in the thickness direction of the first passivation layer 5. In this case, it is appropriate that at the interface between the first passivation layer 5 and the first semiconductor region 2, the dangling bonds of Si as a semiconductor material of the first semiconductor region 2 be passivated by methyl groups. Accordingly, the passivation effect due to the first passivation layer 5 further increases. As a result, the effective lifetime in the first semiconductor region 2 is extended, and thus the conversion efficiency in the solar cell element 10 is further increased.

furthermore, the effective lifetime in the first semiconductor region 2 is extended in proportion to the atomic density $A_H$ of H and the atomic density $A_C$ of C at the central portion in the thickness direction of the first passivation layer 5, and in the vicinity of the interface with the first semiconductor region 2 in the first passivation layer 5.

Here, it is assumed that the effective lifetime in the first semiconductor region 2 is extended as a result of stabilization of the Al deficient portion in aluminum oxide and passivation of the dangling bonds of Si in the interface due to H, OH, $CH_n$ (n is a natural number), O, and the like, along with an increase in the atomic density $A_H$ of H. On the other hand, the reason for the extension of the effective lifetime in the first semiconductor region 2 along with an increase in the atomic density $A_C$ of C is not clear. However, it is assumed that, when the first passivation layer 5 is formed by the ALD method by using TMA as a raw material, as a result of increasing of an amount of $CH_n$ (n is a natural number) in the passivation layer 5 in order to increase the atomic density $A_H$ of H, the atomic density $A_C$ of C also increases. $CH_n$ may be supplied by TMA, and may be supplied in other types such as methane gas.

It is appropriate that a ratio (a value obtained by dividing the atomic density of H by the atomic density of C: hereinafter, referred to as a third ratio) $R_{H/C}$ of the atomic density of H on the basis of the atomic density of C in the vicinity of the interface with the first semiconductor region 2 in the first passivation layer 5 be larger than a third ratio $R_{H/C}$ at the central portion in a thickness direction of the first passivation layer 5. In this case, since the passivation effect can be improved, the effective lifetime in the first semiconductor region 2 is extended. As a result, it is possible to further increase the conversion efficiency in the solar cell element 10.

Here, in a case where the first passivation layer 5 is formed using the ALD method, the third ratio $R_{H/C}$ becomes larger than 1 in the vicinity of the interface with the first semiconductor region 2 in the first passivation layer 5. Accordingly, it is assumed that H is present mainly in a manner of H (or OH) or $CH_n$ (n is a natural number) in the vicinity of an interface with the first semiconductor region 2 in the first passivation layer 5. In contrast, in a region ranging from the central portion in the thickness direction of the first passivation layer 5 to the first main surface 10a, the third ratio $R_{H/C}$ becomes less than 1. Accordingly, it is assumed that in the region ranging from the central portion in the thickness direction of the first passivation layer 5 to the first main surface 10a, H is present mainly in a manner of H (or OH), and C is present mainly in a manner of coupling with Al or O.

Accordingly, in this case, it is assumed that, in the interface between the first passivation layer 5 and the first semiconductor region 2, the dangling bonds of Si as a semiconductor material of the first semiconductor region 2 are passivated by methyl groups and the like. According to the above structure, the passivation effect due to the first passivation layer 5 further increases. As a result, the effective lifetime in the first semiconductor region 2 is extended, and thus the conversion efficiency in the solar cell element 10 is further increased.

<Method of Manufacturing Solar Cell Element>

Figure 6:
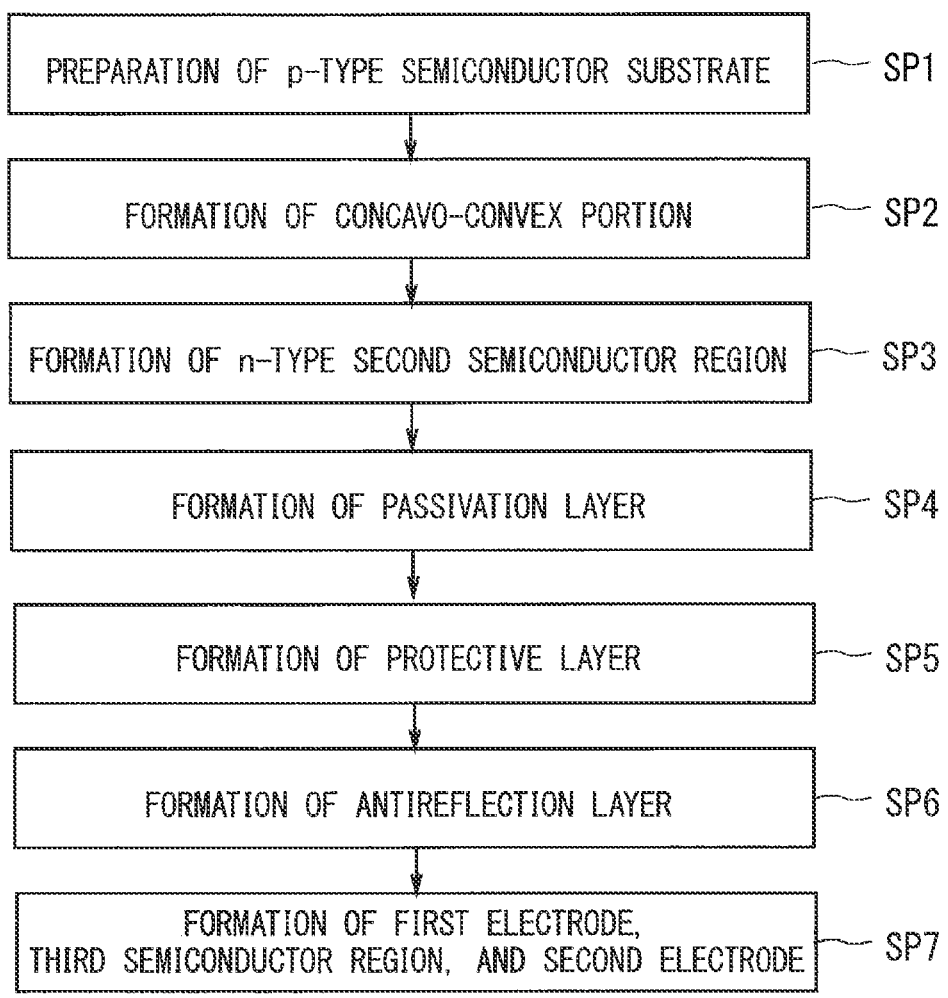
FIG. 6 is a flowchart illustrating a manufacturing flow of the solar cell element according to the embodiment of the invention.

Here, an example of a process of manufacturing the solar cell element 10 having the above-described configuration will be described. FIG. 6 is a flowchart illustrating a manufacturing flow of the solar cell element 10. Here, as illustrated in FIG. 6, step SP1 to step SP7 are sequentially performed to manufacture the solar cell element 10.

First, in step SP1, a process of preparing the p-type semiconductor substrate 1 is performed. Here, in a case where the semiconductor substrate 1 is a single crystal silicon substrate, for example, the semiconductor substrate 1 is formed using a FZ (Floating Zone) method and the like. In a case where the semiconductor substrate 1 a polycrystal silicon substrate, for example, the semiconductor substrate 1 is formed using a casting method and the like. Here, an example in which the p-type polycrystal silicon substrate is used as the semiconductor substrate 1 will be described. First, a polycrystal silicon ingot is prepared as a semiconductor material, for example, by the casting method. Next, the ingot is sliced, for example, in a thickness of 250 μm or less. After that, for example, etching in an extremely small amount by using an aqueous solution such as NaOH, KOH, hydrofluoric acid, or nitrohydrofluoric acid is performed with respect to a surface of the semiconductor substrate 1 to remove a layer having mechanical damage and a contaminated layer on a cut-out surface of the semiconductor substrate 1.

In step SP2, in the first and second main surfaces 1a and 1b of the semiconductor substrate 1, a concavo-convex portion is formed in at least the second main surface 1b. As a method of forming the concavo-convex portion, for example, a wet-etching method using an alkali solution such as NaOH or an acid solution such as nitrohydrofluoric acid, or a dry-etching method using RIE (Reactive Ion Etching) and the like is employed.

In step SP3, the second semiconductor region 3 of an n-type conductivity type is formed in the second main surface 1b of the semiconductor substrate 1 in which the concavo-convex portion has been formed. Here, it is adequate that the thickness of the second semiconductor region 3 is approximately not less than 0.2 μm and not more than 2 μm. It is adequate that a sheet resistance value of the second semiconductor region 3 is not less than 40 Ω/☐ and not more than 200 Ω/☐. As a method of forming the second semiconductor region 3, for example, an application and thermal diffusion method in which $P_2O_5$ in a paste form is applied onto a surface of the semiconductor substrate 1 and then thermal diffusion is performed, a vapor phase thermal diffusion method in which $POCl_3$ (phosphorus oxychloride) in a vapor phase is used as a diffusion source, and the like are employed.

Here, for example, in the case of employing the vapor phase thermal diffusion method, first, a heat treatment with respect to the semiconductor substrate 1 is performed in an atmosphere containing the diffusion gas such as $POCl_3$ at a temperature region of approximately not less than 600° C. and not more than 800° C. Accordingly, phosphorous glass is formed on the second main surface 1b of the semiconductor substrate 1. It is adequate that time taken for the heat treatment is, for example, approximately not less than 5 minutes and not more than 30 minutes. Then, a heat treatment with respect to the semiconductor substrate 1 is performed in an atmosphere containing an inert gas such as argon and nitrogen in a high-temperature region of approximately not less than 800° C. and not more than 900° C. Accordingly, phosphorous diffuses from the phosphorous glass to a region on a second main surface 1b side of the semiconductor substrate 1, and thus the second semiconductor region 3 is formed. It is adequate that time taken for the heat treatment is set, for example, approximately not less than 10 minutes and not more than 40 minutes.

However, at the time of forming the second semiconductor region 3, if the second semiconductor region 3 is also formed on a first main surface 1a side of the semiconductor substrate 1, it is encouraged that the second semiconductor region 3 formed on the first main surface 1a side is removed by etching. Accordingly, in the first main surface 1a of the semiconductor substrate 1, the semiconductor region 2 of the p-type conductivity type is exposed. For example, only the first main surface 1a side of the semiconductor substrate 1 is immersed in a nitrohydrofluoric acid solution to remove the second semiconductor region 3 that is formed on the first main surface 1a side. In addition, it is appropriate that the phosphorous glass that has been formed on the second main surface 1b side of the semiconductor substrate 1 is removed by etching in a subsequent process. When the second semiconductor region 3 which has been formed on the first main surface 1a side is removed in a state in which the phosphorous glass remains on the second main surface 1b of the semiconductor substrate 1, as described above, removal of the second semiconductor region 3 on the second main surface 1b side and damage applied to the second semiconductor region 3 are less likely to occur. At this time, the second semiconductor region 3 which has been formed on a side surface 1c side of the semiconductor substrate 1 may also be removed in a state in which the phosphorus glass remains on the second main surface 1b of the semiconductor substrate 1.

Alternatively, the second semiconductor region 3 may be formed by the vapor phase thermal diffusion method and the like in a state in which a diffusion mask is disposed in advance on the first main surface 1a of the semiconductor substrate 1, which is followed by the removal of the diffusion mask. According to such a process, the second semiconductor region 3 is not formed on the first main surface 1a side of the semiconductor substrate 1. Accordingly, it is not necessary to perform the process of removing the second semiconductor region 3 that has been formed on the first main surface 1a side of the semiconductor substrate 1.

Note that, the method of forming the second semiconductor region 3 is not limited to the above-described method. For example, a thin film technology may be used to form an n-type hydrogenated amorphous silicon film, a crystal silicon film including a microcrystal silicon film, and the like. In addition, a silicon region with an i-type conductivity type may be formed between the first semiconductor region 2 and the second semiconductor region 3.

In next step SP4, the first passivation layer 5 is formed on the first main surface 1a of the first semiconductor region 2, and the second passivation layer 6 is formed on the second main surface 1b of the second semiconductor region 3. As a method of forming the first passivation layer 5 and the second passivation layer 6, for example, the ALD method may be employed. With this method, the first passivation layer 5 and the second passivation layer 6 can be formed simultaneously at the entire periphery of the semiconductor substrate 1. That is, a passivation layer including an aluminum oxide layer can be also formed on the side surface 1c of the semiconductor substrate 1.

In the case of employing the ALD method, the semiconductor substrate 1 in which the second semiconductor region 3 has been formed in step SP3 is put inside a chamber of a film forming apparatus, and then, the following processes A to D are repeated in a state in which the semiconductor substrate 1 is heated in a temperature region of not less than 100° C. and not more than 250° C. Accordingly, the first passivation layer 5 and the second passivation layer 6 having desired thicknesses are formed.

[Process A]

An Al raw material such as TMA is supplied onto a surface of the semiconductor substrate 1 in combination with a carrier gas such as an Ar gas and a $N_2$ gas, so that the Al raw material is absorbed to the entire periphery of the semiconductor substrate 1. Here, it is preferable that dangling bonds on a surface of the semiconductor substrate 1 bepassivated by an OH group type. That is, in the case of a Silicon substrate, a Si—O—H type is preferable. This structure may be formed in accordance with rinsing conditions with pure water in a process of processing the Silicon substrate with dilute hydrofluoric acid, the subsequent processing with an oxidizing solution such as nitric acid, ozone processing, and the like. It is adequate that time taken to supply the TMA is, for example, approximately not less than 15 ms and not more than 3 seconds. In Process A, the following reaction occurs.

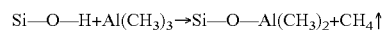

Si—O—H+Al(CH$_3$)$_3$→Si—O—Al(CH$_3$)$_2$+CH$_4$↑

The Al raw material is absorbed to the entire periphery of the semiconductor substrate 1 through the reaction.

[Process B]

The inside of a chamber of a film forming apparatus is purified using a $N_2$ gas to remove the Al raw material that remains inside the chamber and to remove the Al raw material that is physically or chemically absorbed to the semiconductor substrate 1, other than a portion that is chemically absorbed in an atomic layer level. Note that, it is adequate that time taken to purify the inside of the chamber with the $N_2$ gas is approximately not less than 1 second and not more the several tens seconds.

[Process C]

An oxidizing agent such as water or an $O_3$ gas is supplied into the chamber of the film forming apparatus to remove a methyl group as an alkyl group contained in the TMA and to substitute the methyl group with an OH group. That is, the following reaction occurs.

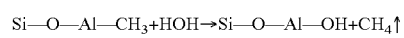

Si—O—Al—CH$_3$+HOH→Si—O—Al—OH+CH$_4$↑

Here, "Si—O—Al—CH$_3$" in a left-handed side should be expressed as "Si—O—Al(CH$_3$)$_2$", to be exact. However, because expression becomes complicated, in the reaction formula, a single reaction with respect to CH$_3$ is expressed.

Accordingly, an atomic layer of aluminum oxide is formed on the semiconductor substrate 1. Note that, it is preferably that time taken to supply the oxidizing agent into the chamber is approximately not less than 750 ms and not more than 1.1 seconds. In addition, if H is supplied into the chamber in combination with the oxidizing agent, for example, H is more easily contained in aluminum oxide.

[Process D]

The inside of the chamber of the film forming apparatus is purified with the $N_2$ gas to remove the oxidizing agent that remains in the chamber. At this time, for example, an oxidizing agent which has not been contributed to the reaction during formation of aluminum oxide in the atomic layer level on the semiconductor substrate 1 and the like are removed. Note that, it is adequate that time taken to purify the inside of the chamber with the $N_2$ gas is, for example, approximately 1 second.

Here, when returning to Process A gain, the following reaction occurs.

Si—O—Al—OH+Al(CH$_3$)$_3$→Si—O—Al—O—Al(CH$_3$)$_2$+CH$_4$↑ Afterward, such as Process B→Process C→Process D→Process A→ . . . , a series of processes of the Process A to Process D are repeated plural times, and thus an aluminum oxide layer is formed with a desired film thickness.

In a case where the first passivation layer 5 and the second passivation layer 6 are formed by the ALD method in above described manner, even when minute concavity and convexity are present on the surface of the semiconductor substrate 1, the aluminum oxide layer can be uniformly formed along the concavity and convexity. Accordingly, the passivation effect on the surface of the semiconductor substrate 1 can be increased.

Next, in step SP5, description will be given to an example of a method of manufacturing the first protective layer 12 and the first repetitive structure 20 as illustrated in FIG. 4, the second protective layer 13 and the second repetitive structure 30 as illustrated in FIG. 5, and the like.

With regard to the first protective unit layer 23 and the second protective unit layer 33, first, the first oxide layer 21 and the third oxide layer 31 which are constituted, for example, by a zirconium oxide layer or a hafnium oxide layer are formed. Then, the second oxide layer 22 and the fourth oxide layer 32 which are constituted, for example, by an aluminum oxide layer are formed. As a method of forming the first oxide layer 21 and the third oxide layer 31, it is encouraged to perform the same method as in above-described step SP4 except that zirconium or hafnium is used instead of aluminum.

However, the reaction that occurs in Process A and Process C is true of zirconium oxide or hafnium oxide, but for example, as a raw material of Zr, TEMAZ (chemical formula: Zr[N(CH$_3$)CH$_2$CH$_3$]$_4$) or TDMAZ (chemical formula: [Zr(N(CH$_3$)$_2$)$_4$]$_2$) may be used in some cases. For example, in the case of TEMAZ, the reaction formula in Process A is as follows.

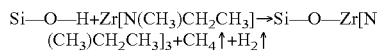

In Process C, a reaction expressed by the following reaction formula occurs.

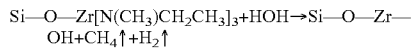

For example, as a raw material of Hf, TEMAH (chemical formula: Hf[N(CH$_3$)CH$_2$CH$_3$]$_4$) or TDMAH (chemical formula: [Hf$_N$(CH$_3$)$_2$)$_4$]$_2$) may be used in some cases. For example, in the case of TEMAH, the reaction formula of Process A is as follows.

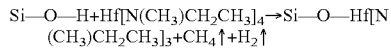

In Process C, a reaction expressed by the following reaction formula occurs.

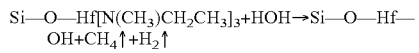

The second oxide layer 22 and the fourth oxide layer 32 can be formed by the same method as in above-described step SP4.

When repetitively performing these processes, it is possible to form the first repetitive structure 20 in which a plurality of the first protective unit layers 23 are stacked on the first passivation layer 5, and the second repetitive structure 30 in which a plurality of the second protective unit layers 33 are stacked on the second passivation layer 6. Here, the first protective layer 12 that is illustrated in FIG. 4 is naturally formed during formation of the first oxide layer 21 of the first protective unit layers 23, and the second protective layer 13 that is illustrated in FIG. 5 is naturally formed during formation of the third oxide layer 31 of the second protective unit layers 33. An oxide layer can be naturally formed between the first oxide layer 21 and the second oxide layer 22 during formation of the second oxide layer 22. An oxide layer can be naturally formed also between the first protective unit layers 23 adjacent to each other during formation of the first oxide layer 21. An oxide layer can be naturally formed between the third oxide layer 31 and the fourth oxide layer 32 during formation of the fourth oxide layer 32. An oxide layer can be naturally formed also between the second protective unit layers 33 adjacent to each other during formation of the third oxide layer 31.

Next, in step SP6, the antireflective layer 7 is formed above the second passivation layer 6 disposed on the second main surface 1b of the semiconductor substrate 1. As a method of forming the antireflective layer 7, for example, a PECVD (plasma enhanced chemical vapor deposition) method, an ALD method, a deposition method, a sputtering method, and the like may be employed. For example, in a case of employing the PECVD method, in a film forming apparatus, a mixed gas of a SiH$_4$ gas and a NH$_3$ gas is diluted with a N$_2$ gas and is formed into plasma state due to glow discharge decomposition in a chamber, and thus silicon nitride is deposited above the second passivation layer 6. Accordingly, the antireflective layer 7 that includes silicon nitride can be formed. In this case, the third protective layer 14 illustrated in FIG. 5 can be naturally formed during formation of the antireflective layer 7. It is adequate that a temperature inside the chamber during deposition of silicon nitride is, for example, approximately 500° C. When the antireflective layer 7 is formed by the PECVD method, the deposition method, the sputtering method, and the like other than the ALD method, the antireflective layer 7 is formed in a short time with a desired thickness. Accordingly, productivity of the solar cell element 10 is improved.

Next, in step SP7, the third semiconductor region 4, the first electrode 8, and the second electrode 9 are formed.

Figure 7:
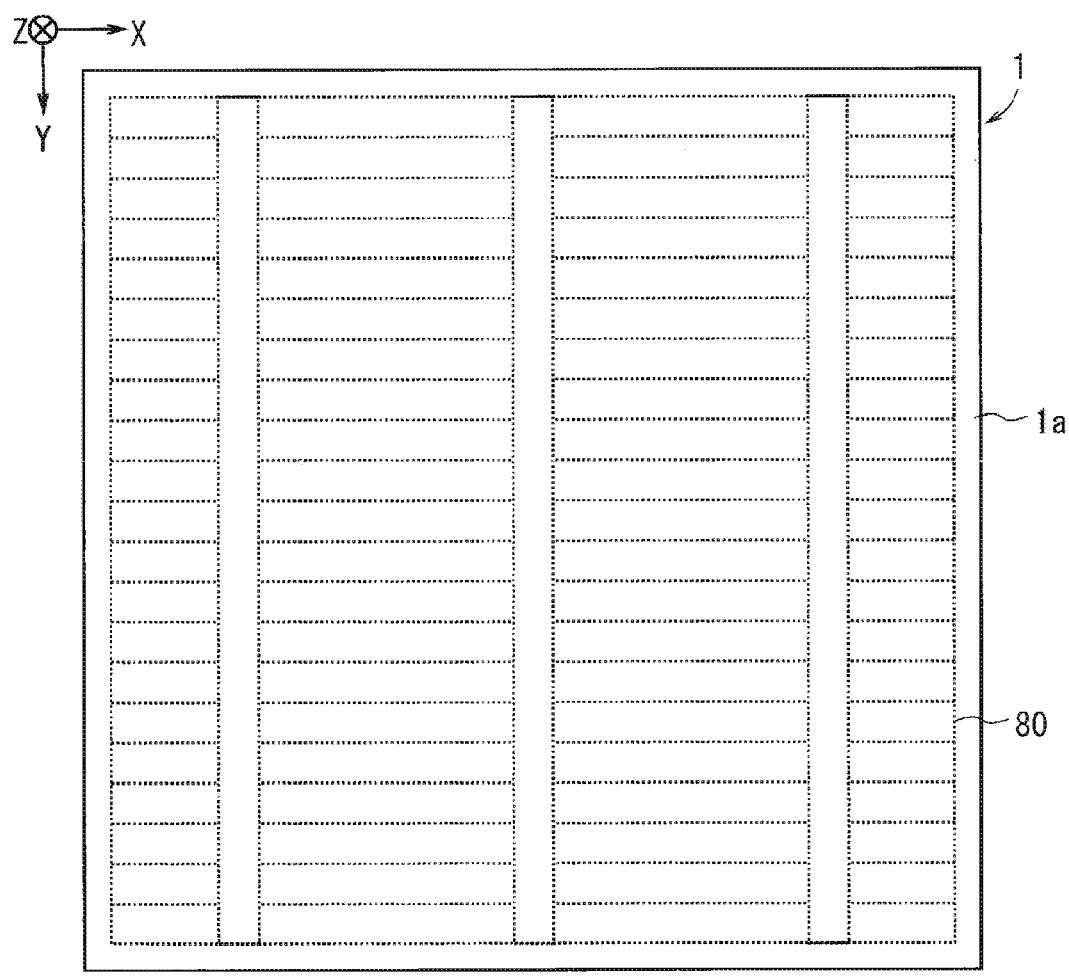
FIG. 7 is a plan view illustrating a region in which a third semiconductor region is formed.

Here, a method of forming the third semiconductor region 4 and the first electrode 8 will be described. First, aluminum paste which contains glass frit and aluminum particles is applied to a predetermined region above the first passivation layer 5. Next, an aluminum paste component penetrates through the first passivation layer 5 by a fire through method in which a heat treatment is performed in a high-temperature region whose highest temperature is not less than 600° C. and not more than 800° C., and thus the third semiconductor region 4 is formed on a first main surface 1a side of the semiconductor substrate 1. At this time, an aluminum layer is formed on the first main surface 1a of the third semiconductor region 4. Here, the aluminum layer can be used as the first current collecting electrode 8b that is a part of the first electrode 8. Here, as illustrated in FIG. 7, it is appropriate that a region in which the third semiconductor region 4 is, for example, a region along a broken line 80, in which parts of the first current collecting electrode 8b and the first output electrode 8a are formed, on the first main surface 1a of the semiconductor substrate 1.

The first output electrode 8a is prepared, for example, by using silver paste that contains a metal powder mainly including silver (Ag) and the like, an organic vehicle, and glass frit. Specifically, silver paste is applied above the first passivation layer 5. Then, the silver paste is fired to form the first output electrode 8a. Here, it is adequate that a highest temperature during the firing is, for example, not less than 600° C. and not more than 800° C. With regard to a firing time including heating-up toward a peak temperature, keeping in the vicinity of the peak temperature for a constant time, and subsequent cooling down, for example, it is adequate that the firing time in the vicinity of the peak temperature is set within several seconds. As a method of applying the silver paste, for example, a screen printing method, and the like may be employed. After applying the silver paste, the silver paste may be dried at a predetermined temperature to evaporate a solvent in the silver paste. Here, the first output electrode 8a comes into contact with the aluminum layer, and is electrically connected to the first current collecting electrode 8b.

The first current collecting electrode 8b may be formed after forming the first output electrode 8a. The first output electrode 8a may not come into direct contact with the semiconductor substrate 1, and the first passivation layer 5 may be present between the first output electrode 8a and the semiconductor substrate 1. The aluminum layer formed on the third semiconductor region 4 may be removed. In addition, the first output electrode 8a and the first current collecting electrode 8b may be formed using the same silver paste.

Next, a method of forming the second electrode 9 will be described. For example, the second electrode 9 is prepared using silver paste that contains a metal powder mainly including silver (Ag) and the like, an organic vehicle, and glass frit. Specifically, the silver paste is applied above the second passivation layer 6 of the semiconductor substrate 1. Then, the silver paste is fired to form the second electrode 9. Here, it is adequate that a highest temperature during the firing is, for example, not less than 600° C. and not more than 800° C. With regard to a firing time, for example, it is adequate that the firing time at a firing peak temperature is set approximately within several seconds. As a method of applying the silver paste, for example, a screen printing method, and the like may be employed. After applying the silver paste, the silver paste may be dried at a predetermined temperature to evaporate a solvent in the silver paste. Here, the second electrode 9 includes the second output electrode 9a and the second current collecting electrode 9b. However, when employing the screen printing method, the second output electrode 9a and the second current collecting electrode 9b can be formed around the same period by one process.

Alternatively, the first electrode 8 and the second electrode 9 may be simultaneously formed by simultaneously performing the firing after applying the paste for each of the electrodes. Note that, in the above-described example, an aspect of forming the first electrode 8 and the second electrode 9 by printing and firing is described, but there is no limitation thereto. For example, the first electrode 8 and the second electrode 9 may be formed by other thin film forming methods such as a deposition method and a sputtering method, or a plating method.

After forming the first passivation layer 5 and the second passivation layer 6, if the highest heat treatment temperature in each electrode forming process is set to 800° C. or lower, the passivation effect due to the first passivation layer 5 and the second passivation layer 6 can be increased. For example, in each electrode forming process after forming the first passivation layer 5 and the second passivation layer 6, it is adequate that a heat treatment time at a temperature region of not less than 300° C. and not more than 500° C. is, for example, not less than 3 minutes and not more than 30 minutes.

<Configuration Example of Solar Cell Module>

A solar cell module 100 according to an embodiment includes one or more solar cell elements 10. For example, it is appropriate that the solar cell module 100 includes a plurality of solar cell elements 10 that are electrically connected to each other. The solar cell module 100 described above is formed by connecting the plurality of solar cell elements 10, for example, in series or in parallel, in a case where an electrical output of a single solar cell element 10 is small. Then, in a case where a plurality of the solar cell modules 100 are combined, for example, an electrical output for practical use can be taken out. Hereinafter, description will be given to an example in which the solar cell module 100 includes the plurality of solar cell elements 10.

Figure 8:
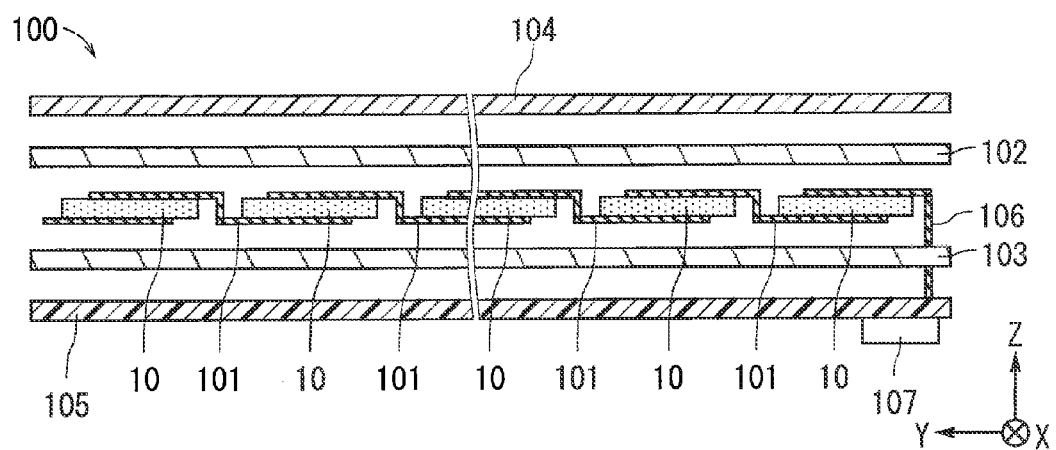
FIG. 8 is an exploded view schematically illustrating a cross-section of a solar cell module according to an embodiment of the invention.

As illustrated in FIG. 8, for example, the solar cell module 100 includes a stacked body in which a transparent member 104, a front side filler 102, a plurality of solar cell elements 10, a wiring member 101, a rear side filler 103, and a rear surface protective material 105 are stacked. Here, the transparent member 104 is a member that protects a light-receiving surface that receives solar light in the solar cell module 100. It is appropriate that the transparent member 104 is, for example, a transparent plate-shaped member. As a material of the transparent member 104, for example, glass and the like are employed. It is appropriate that the front side filler 102 and the rear side filler 103 are constituted by, for example, a transparent filler material. As the material of the front side filler 102 and the rear side filler 103, for example, ethylene-vinyl acetate copolymer (EVA) and the like are employed. The rear surface protective material 105 is a member that protects the solar cell module 100 from a rear surface. As a material of the rear surface protective material 105, for example, polyethylene terephthalate (PET), polyvinyl fluoride resin (PVF), and the like are employed. Note that, the rear surface protective material 105 may have a single-layer structure or a stacked structure.

The wiring member 101 is a member (connection member) that electrically connect the plurality of solar cell elements 10. Among the plurality of solar cell elements 10 included in the solar cell module 100, in solar cell elements 10 that are adjacent to each other in the Y direction, the first electrode 8 of one solar cell element 10 and the second electrode 9 of the other solar cell element 10 are connected by the wiring member 101. Accordingly, the plurality of solar cell elements 10 are electrically connected in series. Here, it is adequate that the thickness of the wiring member 101 is, for example, approximately not less than 0.1 mm and not more than 0.2 mm. A width of the wiring member 101 may be, for example, approximately 2 mm. As the wiring member 101, for example, a member obtained by coating the entire surface of copper foil with solder, and the like are employed.

Figure 9:
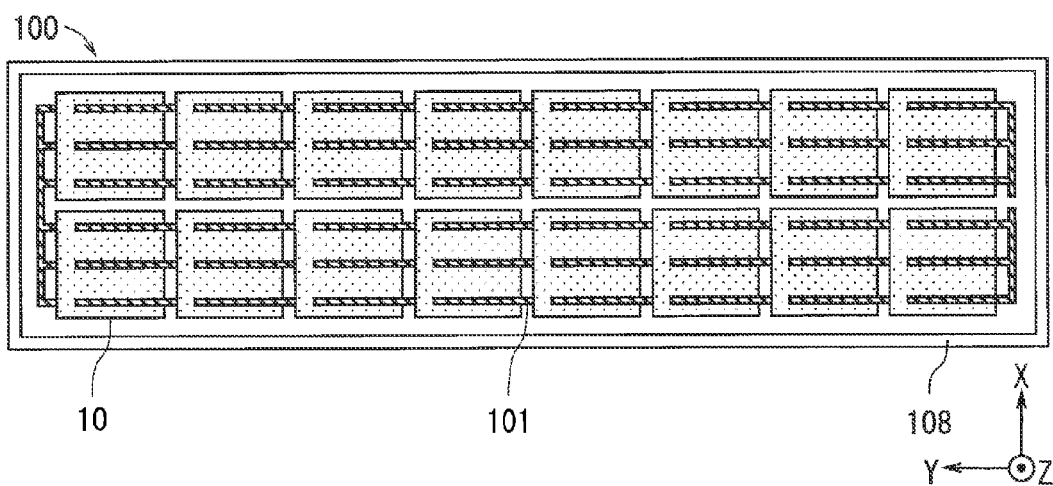
FIG. 9 is a plan view schematically illustrating external appearance of the solar cell module according to the embodiment of the invention.

Among the plurality of solar cell elements 10 that are electrically connected in series, one end of an electrode of an initial solar cell element 10 and one end of an electrode of a final solar cell element 10 are electrically connected to respective terminal boxes 107 that are output terminal units by output wirings 106. Although not illustrated in FIG. 8, as illustrated in FIG. 9, the solar cell module 100 may include a frame body 108 that retains the stacked body from the periphery. As a material of the frame body 108, for example, aluminum, which has both corrosion resistance and strength, and the like are employed.

Note that, in a case where EVA is employed as the material of the front side filler 102, since EVA includes vinyl acetate, hydrolysis may occur with the passage of time due to permeation of humidity, water, and the like at a high temperature, thereafter to generate acetic acid. In contrast, in this embodiment, since the antireflective layer 7 is provided above the second passivation layer 6, and thus damage in the solar cell element 10 due to the acetic acid may be reduced. As a result, it is possible to secure reliability of the solar cell module 100 for a long period of time.

In addition, in a case of employing EVA as a material of at least one of the front side filler 102 and the rear side filler 103, an acid acceptor which includes magnesium hydroxide, calcium hydroxide, and the like may be added to EVA. Accordingly, since generation of acetic acid from EVA is reduced, durability of the solar cell module 100 is improved, and thus damage in the first passivation layer 5 and the second passivation layer 6 due to the acetic acid may be further reduced. As a result, it is possible to secure the reliability of the solar cell module 100 for a long period of time.

<Modification Example>

The invention is not limited to the above-described embodiment, and various modifications, changes, and the like can be made in a range not departing from the gist of the invention.

For example, in the above-described embodiment, the first passivation layer 5 is disposed on the non-light-receiving surface side of the solar cell element 10, but there is not limitation thereto. For example, in a case where an n-type semiconductor region is disposed on a non-light-receiving surface side and a p-type semiconductor region is disposed on a light-receiving surface side in the semiconductor substrate 1, it is appropriate that the first passivation layer 5 is disposed on the light-receiving surface side of the solar cell element 10.

Furthermore, the solar cell element 10 may be a back contact type solar cell element having a metal-wrap-through structure in which the second output electrode 9a is disposed on the first main surface 10a side.

In addition, a CVD method may be applied during preparation of the first passivation layer 5 and the second passivation layer 6, without limitation to the ALD method. However, in a case where preparing all of the first passivation layer 5, the second passivation layer 6, the first protective layer 12, the second protective layer 13, the first repetitive structure 20, and the second repetitive structure 30 by using the ALD method, a process may be simplified, and thus it is possible to rapidly prepare the solar cell element 10.

EXAMPLES

Hereinafter, a specific example of the above-described embodiment will be described. Description will be made with reference to FIGS. 1 to 7.

<Preparation of Sample>

First, as the semiconductor substrate 1, a plurality of sheets of polycrystal silicon substrate having a square shape in a plan view in which one side is approximately 156 mm, and a thickness is approximately 200 μm were prepared. As the polycrystal silicon substrates, p-type polycrystal silicon substrates (silicon substrates) which were doped with boron, and had specific resistance of approximately 1.5 Ω·cm were used. A surface of each of the silicon substrates was etched with a NaOH aqueous solution, and was subjected to washing. The following treatments were performed with respect to the silicon substrates that were prepared as described above.

First, a texture (concavo-convex structure) was formed on a surface side of the silicon substrate by using a RIE method.

Next, phosphorus was allowed to diffuse by using a vapor phase thermal diffusion method in which phosphorus oxychloride ($POCl_3$) was used as a diffusion source to form an n-type reverse-conductivity type layer having sheet resistance of approximately 90 Ω/□ on a front surface of the silicon substrate. A reverse-conductivity type layer formed on a side surface and a rear surface of the silicon substrate was removed with a nitrohydrofluoric solution, and then phosphorous glass that remained was removed with a hydrofluoric acid solution.

Next, the first passivation layer 5 and the second passivation layer 6, which were constituted by an aluminum oxide layer, were formed on the entire surface of the silicon substrate by the ALD method.

The first repetitive structure 20 was formed on the first passivation layer 5, and the second repetitive structure 30 was formed on the second passivation layer 6. Here, the silicon substrate was put inside the chamber of the film forming apparatus, and a surface temperature of the silicon substrate was retained at not less than 100° C. and not more than 200° C. The above-described processes A to D were repeated to form the first passivation layer 5, the second passivation layer 6, the first repetitive structure 20 and the second repetitive structure 30 with a desired thickness.

In Process A of the ALD method, a $N_2$ gas was used as a carrier gas. At this time, a flow rate of the $N_2$ gas that was introduced into the chamber was set to approximately 100 sccm. Time (opening time) taken to supply TMA into the chamber was set to approximately 1 second.

In Process B of the ALD method, time (substitution time) from termination of the supply of TMA into the chamber to initiation of Process C was set to time for which the inside of the chamber was purified. The substitution time was set to approximately 15 seconds. At this time, the flow rate of the $N_2$ gas that was introduced into the chamber was set to approximately 100 sccm.

In Process C of the ALD method, an $O_3$ gas was used as an oxidizing agent. Time (opening time) taken to supply the $O_3$ gas into the chamber was set to approximately 750 ms.

In Process D of the ALD method, time (substitution time) from termination of the supply of the $O_3$ gas into the chamber to initiation of the subsequent process was set to time for which the inside of the chamber was purified. The substitution time was set to approximately 15 seconds. At this time, the flow rate of the $N_2$ gas that was introduced into the chamber was set to approximately 100 sccm.

As a result of the above-described treatments, an average thickness of the first passivation layer 5 and the second passivation layer 6 was approximately 30 nm. The average thickness is an average value of results measured at respective five sites of each of the first passivation layer 5 and the second passivation layer 6 by using ellipsometer (SE-400adv, manufactured by SENTECH CO., LTD).

With regard to a heat treatment with respect to the first passivation layer 5 and the second passivation layer 6, annealing was performed with respect to the silicon substrate in the $N_2$ gas at approximately 450°C. For 15 minutes.

With regard to the first repetitive structure 20 (layer in which one or a plurality of the first protective unit layers 23 including the first oxide layer 21 being a zirconium oxide layer and the second oxide layer 22 being an aluminum oxide layer were stacked) and the second repetitive structure 30 (layer in which one or a plurality of the second protective unit layers 33 including the third oxide layer 31 being a zirconium oxide layer and the fourth oxide layer 32 being an aluminum oxide layer were stacked), film formation of the first oxide layers 21 and the third oxide layer 31 was performed by the following process. With regard to the second oxide layers 22 and the fourth oxide layer 32, film formation was performed in the same manner as in formation of the passivation layer.

A process of forming the first oxide layers 21 and the third oxide layer 31 will be described. First, in Process A of the ALD method, a $N_2$ gas was employed as a carrier gas. At this time, a flow rate of the $N_2$ gas that was introduced into the chamber was set to approximately 100 sccm. Time (opening time) taken to supply TEMAZ into the chamber was set to approximately 2 seconds.

In Process B of the ALD method, time (substitution time) from termination of the supply of TEMAZ into the chamber to initiation of Process C was set to time for which the inside of the chamber was purified. The substitution time was set to approximately 40 seconds. At this time, the flow rate of the $N_2$ gas that was introduced into the chamber was set to approximately 100 sccm.

In Process C of the ALD method, an $O_3$ gas was used as an oxidizing agent. Time (opening time) taken to supply the $O_3$ gas into the chamber was set to approximately 750 ms.

In Process D of the ALD method, time (substitution time) from termination of the supply of the $O_3$ gas into the chamber to initiation of the subsequent process was set to time for which the inside of the chamber was purified. The substitution time was set to approximately 15 seconds. At this time, the flow rate of the $N_2$ gas that was introduced into the chamber was set to approximately 100 sccm.

An average thickness of the first oxide layer 21, the third oxide layer 31, the second oxide layer 22, and the fourth oxide layer 32 was set to 1.25 nm, and the number of stacking of the first protective unit layer 23 and the second protective unit layer 33 was set as shown in Table 1 (Samples 2 to 4). These average thicknesses were set in accordance with a film formation rate that was calculated by results measured from the zirconium oxide single layer or the aluminum oxide single layer by using ellipsometer (SE-400adv, manufactured by SENTECH CO., LTD).

In addition, as Comparative Example, a sample which did not include the first repetitive structure 20 and the second repetitive structure 30 was prepared (Sample 1).

Then, to confirm an effect of the heat treatment during formation of the reflective layer 7, the third semiconductor region 4, the first electrode 8, and the second electrode 9, various kinds of heat treatments were performed with respect to the semiconductor substrate 1 in which the first passivation layer 5 and the second passivation layer 6 were formed.

Here, in Samples 2 to 4 in Table 1, it was confirmed that the first protective layer 12, the oxide layer present between the first oxide layer 21 and the second oxide layer 22, and the oxide layer present between the first protective unit layers 23 adjacent to each other were naturally formed, as illustrated in FIG. 4. In addition, it was confirmed that the second protective layer 13, the oxide layer present between the third oxide layer 31 and the fourth oxide layer 32, the oxide layer present between the second protective unit layers 33 adjacent to each other, and the oxide layer present between the antireflective layer 7 and the fourth oxide layer 32 adjacent thereto were naturally formed, as illustrated in FIG. 5.

Presence of elements that constituted the oxide layers was confirmed by TEM (TITAN80-300, manufactured by FET CO., LTD). Particularly, it was confirmed that the first protective layer 12, the oxide layer present between the first oxide layer 21 and the second oxide layer 22, and the oxide layer present between first protective unit layers 23 adjacent to each other were constituted by $Zr_xAl_yO_{1-x-y}$ having a thickness smaller than 1 nm. In addition, it was confirmed that the second protective layer 13, the oxide layer present between the third oxide layer 31 and the fourth oxide layer 32, and the oxide layer present between the second protective unit layers 33 adjacent to each other were constituted by $Zr_xAl_yO_{1-x-y}$ having a thickness smaller than 1 nm.

After preparing the solar cell element, solar cell modules (Samples 1 to 4 in Table 1) illustrated in FIG. 6 were prepared, and the following reliability test was performed with respect to respective Samples 1 to 4.

In the reliability test, an open-circuit voltage Voc, which is an output characteristic of a solar cell, was measured. In addition, each of the samples was put into a constant-temperature and constant-humidity tester maintained at a temperature of 125° C. and humidity of 95%, and a retention rate from the initial Voc was measured after 200 hours and 630 hours, respectively. Note that, measurement of the characteristic was performed on the basis of JIS C 8913 under conditions of AM (Air Mass) of 1.5 and irradiation of 100 $mW/cm^2$.

TABLE 1

|  | The number of stacking of first protective unit layers | The number of stacking of second protective unit layers | Retention rate (%) of initial Voc after reliability test at temperature of 125° C. and humidity of 95% | |
|---|---|---|---|---|
|  |  |  | After 200 hours | After 630 hours |
| Sample 1 | 0 | 0 | 97.6 | 97.3 |
| Sample 2 | 1 | 1 | 97.9 | 97.8 |
| Sample 3 | 2 | 2 | 98.4 | 97.9 |
| Sample 4 | 4 | 4 | 100 | 100 |

As can be seen from results shown in Table 1, in Sample 1 in which the first protective unit layer 23 and the second protective unit layer 33 were not provided, the retention rate of the initial Voc was low. In contrast, in Samples 2 to 4, the more the number of stacking of the first protective unit layer 23 and the second protective unit layer 33 was increased, the higher the retention rate of the initial Voc was. Particularly, it was proved that in a case where the number of stacking of the first protective unit layer 23 and the second protective unit layer 33 was 4, such as Sample 4, the retention rate of the initial Voc became 100%. That is, according to this example, the effect due to the first repetitive structure 20 and the second repetitive structure 30 could be confirmed.

REFERENCE SIGNS LIST

1: Semiconductor substrate
1a, 10a: First main surface
1b, 10b: Second main surface
2: First semiconductor region
3: Second semiconductor region
4: Third semiconductor region
5: First passivation layer
6: Second passivation layer
7: Antireflection layer
8: First electrode 9: Second electrode
12: First protective layer
13: Second protective layer
14: Third protective layer
20: First repetitive structure
21: First oxide layer
22: Second oxide layer
31: Third oxide layer
32: Fourth oxide layer
23: First protective unit layer
30: Second repetitive structure
33: Second protective unit layer
10: Solar cell element
100: Solar cell module

The invention claimed is:

1. A solar cell element, comprising:
a semiconductor substrate which includes a first main surface and a second main surface that is positioned opposite to the first main surface, and in which a p-type semiconductor region and an n-type semiconductor region are stacked in such a manner that the p-type semiconductor region is positioned closest to the first main surface and the n-type semiconductor region is positioned closest to the second main surface;
a first passivation layer which is disposed on the p-type semiconductor region that is positioned closest to the first main surface, and which includes aluminum oxide; and
a first protective layer that is disposed on the first passivation layer,
wherein the first protective layer includes an oxide that contains at least one kind of zirconium and hafnium,
the first passivation layer includes hydrogen atom and carbon atom,
a ratio obtained by dividing an atomic density of aluminum by an atom density of oxygen is 0.613 or greater and is less than 0.667 in the first passivation layer,
a ratio obtained by dividing an atomic density of hydrogen by an atomic density of carbon in the vicinity of the interface with the p-type semiconductor region in the first passivation layer is larger than the ratio at the central portion in a thickness direction of the first passivation layer.

2. The solar cell element according to claim 1, wherein the first protective layer is an oxide that contains zirconium and aluminum, or an oxide that contains hafnium and aluminum.

3. The solar cell element according to claim 1, wherein a first oxide layer formed from zirconium oxide or hafnium oxide is disposed on the first protective layer.

4. The solar cell element according to claim 1, wherein a first protective unit layer, in which a first oxide layer formed from zirconium oxide or hafnium oxide and a second oxide layer formed from aluminum oxide are provided in this order from a position close to the first passivation layer to a position distant from the first passivation layer, is disposed on the first protective layer.

5. The solar cell element according to claim 4, wherein in the first protective unit layer, an oxide layer that contains zirconium and aluminum or an oxide layer that contains hafnium and aluminum is interposed between the first oxide layer and the second oxide layer.

6. The solar cell element according to claim 4, wherein a plurality of the first protective unit layers are stacked on the first protective layer.

7. The solar cell element according to claim 6, wherein an oxide layer that contains zirconium and aluminum or an oxide layer that contains hafnium and aluminum is interposed between the first protective unit layers that are adjacent to each other.

8. The solar cell element according to claim 1, further comprising:
a second passivation layer which is disposed on the n-type semiconductor region that is positioned closest to the second main surface, and which include aluminum oxide; and
a second protective layer that is disposed on the second passivation layer,
wherein the second protective layer includes an oxide that contains at least one kind of zirconium and hafnium.

9. The solar cell element according to claim 8, wherein the second protective layer is an oxide that contains zirconium and aluminum or an oxide that contains hafnium and aluminum.

10. The solar cell element according to claim 9, wherein a third oxide layer formed from zirconium oxide or hafnium oxide is disposed on the second protective layer.

11. The solar cell element according to claim 9, wherein a second protective unit layer, in which a third oxide layer formed from zirconium oxide or hafnium oxide and a fourth oxide layer formed from aluminum oxide are provided in this order from a position close to the second passivation layer to a position distant from the second passivation layer, is disposed on the second protective layer.

12. The solar cell element according to claim 8, wherein a third oxide layer formed from zirconium oxide or hafnium oxide is disposed on the second protective layer.

13. The solar cell element according to claim 8, wherein a second protective unit layer, in which a third oxide layer formed from zirconium oxide or hafnium oxide and a fourth oxide layer formed from aluminum oxide are provided in this order from a position close to the second passivation layer to a position distant from the second passivation layer, is disposed on the second protective layer.

14. The solar cell element according to claim 13, wherein in the second protective unit layer, an oxide layer that contains zirconium and aluminum or an oxide layer that contains hafnium and aluminum is interposed between the third oxide layer and the fourth oxide layer.

15. The solar cell element according to claim 13, wherein a plurality of the second protective unit layers are stacked on the second protective layer.

16. The solar cell element according to claim 15, wherein an oxide layer that contains zirconium and aluminum or an oxide layer that contains hafnium and aluminum is interposed between the second protective unit layers that are adjacent to each other.

* * * * *